(12) United States Patent
Conta et al.

(10) Patent No.: US 7,394,321 B2
(45) Date of Patent: Jul. 1, 2008

(54) QUADRATURE VCO SYSTEM AND METHOD

(75) Inventors: Matteo Conta, Irvine, CA (US);
Ramesh Chokkalingam, Irvine, CA (US); David A. Weldon, Laguna Hills, CA (US)

(73) Assignee: GloNav Limited, Dublin (IE)

( * ) Notice: Subject to any disclaimer, the term of this patent is extended or adjusted under 35 U.S.C. 154(b) by 74 days.

(21) Appl. No.: 11/096,131

(22) Filed: Mar. 30, 2005

(65) Prior Publication Data

US 2007/0268075 A1    Nov. 22, 2007

Related U.S. Application Data

(60) Provisional application No. 60/559,200, filed on Apr. 1, 2004.

(51) Int. Cl.
*H03L 7/00*    (2006.01)

(52) U.S. Cl. ............................. 331/12; 455/260; 331/2; 331/46

(58) Field of Classification Search ................. 331/57, 331/16, 45, 12, 2, 46; 375/376; 455/260
See application file for complete search history.

(56) References Cited

U.S. PATENT DOCUMENTS

| | | | |
|---|---|---|---|
| 6,016,422 A | 1/2000 | Bartusiak | |
| 6,356,131 B1 | 3/2002 | Kuwano | |
| 6,727,764 B2 * | 4/2004 | Manku et al. | 331/57 |
| 7,079,591 B2 * | 7/2006 | Fling et al. | 375/316 |
| 2004/0263262 A1 | 12/2004 | Ravi | |

FOREIGN PATENT DOCUMENTS

WO    WO 02/51091 A    6/2002

* cited by examiner

*Primary Examiner*—Arnold Kinkead
(74) *Attorney, Agent, or Firm*—Carr & Ferrell LLP

(57) ABSTRACT

A low-power quadrature generator is provided for accurately generating in-phase signals and quadrature signals.

7 Claims, 9 Drawing Sheets

QUADRATURE VCO SYSTEM AND METHOD

CROSS-REFERENCE TO RELATED APPLICATION

This application claims benefit of U.S. provisional patent application No. 60/559,200 entitled "Quadrature VCO System and Method," filed on Apr. 1, 2004, which is incorporated by reference herein.

BACKGROUND

1. Field of the Invention

The present invention relates generally to electronic communications, and more particularly to a system and method for generating in-phase and quadrature signals for use in a communications system or device.

2. Background Art

Modern wireless communications devices use in-phase signals and quadrature signals for modulating and demodulating communications signals. The in-phase and quadrature signals have the same frequency but differ in phase. While the in-phase signals and the quadrature signals have a phase difference of 180 degrees, the in-phase signals have a 90 degree phase difference with respect to the quadrature signals.

Well known wireless communications devices include a local oscillator (LO) for generating the in-phase signals and quadrature signals. In these wireless communications devices, the LO includes a voltage controlled oscillator (VCO) that generates a reference signal at a desired frequency and a quadrature generator that generates the in-phase and quadrature signals based on the reference signal.

One characteristic that affects the power consumption in these wireless communications devices is the phase error between the in-phase signals and quadrature signals. Specifically, the power consumption of the wireless communications device increases with the phase error between the in-phase and quadrature signals. Accordingly, an LO with a low phase error is generally desirable to limit power consumption in these known wireless communications devices. However, the implementation of the LO in these wireless communications devices to achieve low phase error (i.e., accuracy) may result in greater power consumption in the LO. Furthermore, the LO typically consumes a significant amount of power in these wireless communications devices.

In light of the above, there exists a need for a low-power quadrature generator for accurately generating in-phase and quadrature signals.

SUMMARY OF THE INVENTION

The present invention addresses a need for a low-power quadrature generator for accurately generating in-phase and quadrature signals. The quadrature generator includes an in-phase signal generator and a quadrature signal generator. The in-phase signal generator includes an in-phase voltage controlled oscillator (IVCO) for generating in-phase signals. The quadrature signal generator includes a quadrature voltage controlled oscillator (QVCO) for generating quadrature signals. The IVCO and QVCO have substantially similar characteristics and thus generate the respective in-phase signals and quadrature signals with approximately the same frequency in response to a similar control voltage.

During initialization of the IVCO, a substantially similar voltage is provided to the IVCO and the QVCO. Consequently, the frequency of the in-phase signals generated by the IVCO is approximately the same as the frequency of the quadrature signals generated by the QVCO, although the in-phase signals may differ in phase with respect to the quadrature signals. The in phase signal generator locks the in-phase signals to the reference signal, after which the quadrature signal generator locks the quadrature signals to the in-phase signals with a 90 degree phase difference. Because the in-phase signals and quadrature signal have approximately the same frequency when the quadrature signal generator begins to lock the quadrature signals to the in-phase signals, the quadrature signal generator quickly locks the quadrature signal to the in-phase signal. Moreover, the quadrature generator minimizes the phase error between the in-phase signals and the quadrature signals, and minimizes power consumption.

In one embodiment, the quadrature generator includes a multiplier that functions as a phase detector in a phase-locked loop. The multiplier includes a pair of substantially symmetrical multiplier circuits that accurately multiply the in-phase signal by the quadrature signals while minimizing power consumption.

DETAILED DESCRIPTION

In accordance with the present invention, a quadrature generator generates in-phase and quadrature signals with low phase error and at a low rate of power consumption. The quadrature generator includes an in-phase signal generator and a quadrature signal generator. The in-phase signal generator includes an in-phase VCO (IVCO) for generating in-phase signals and the quadrature signal generator includes a quadrature VCO (QVCO) for generating quadrature signals. During initialization of the quadrature generator, the QVCO tracks the IVCO until the IVCO locks to a reference signal. While the QVCO tracks the IVCO, the in-phase signals and quadrature signals have approximately the same frequency, although these signals may differ in phase. Once the IVCO is locked to the reference frequency signal, the QVCO locks the quadrature signal to the in-phase signal with a 90 degree phase difference between the in-phase signals and quadrature signals. Accordingly, the in-phase and quadrature signals are locked in quadrature to the reference signal.

Figure 1:
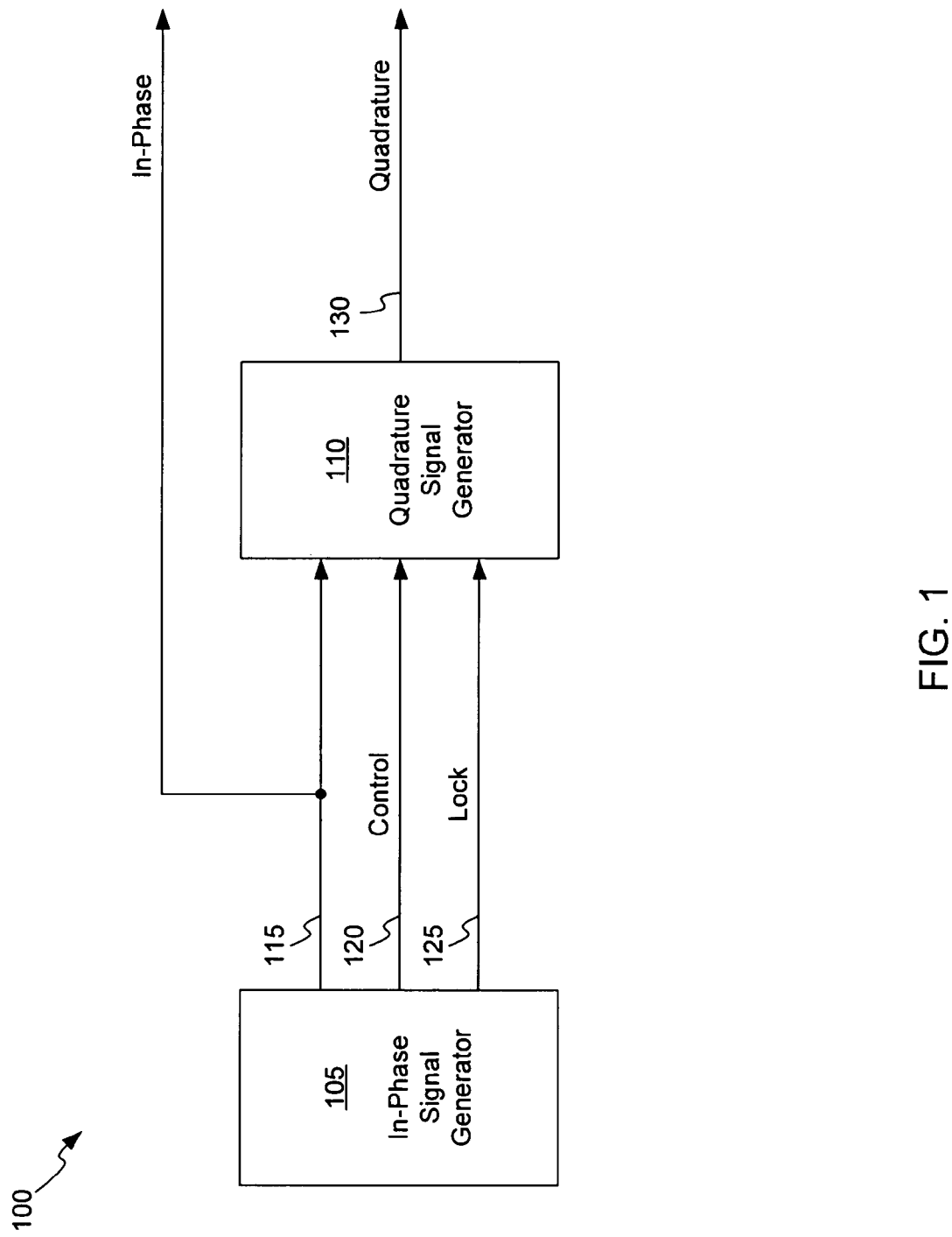
FIG. 1 is a block diagram of a quadrature generator, in accordance with the present invention.

Referring to FIG. 1, a quadrature generator 100 is shown. The quadrature generator 100 includes an in-phase signal generator 105 and a quadrature signal generator 110. The in-phase signal generator 105 generates in-phase signals 115. The in-phase signals 115 have approximately the same frequency but differ in phase by approximately 180 degrees.

The in-phase signal generator 105 also generates a control signal 120 and a lock signal 125. The control signal 120 controls the frequency of the in-phase signals 115, as is described more fully herein. The lock signal 125 indicates that the in-phase signals 115 are locked to a reference signal, as is described more fully herein. The in-phase signal generator 105 provides the in-phase signals 115, control signal 120, and lock signal 125 to the quadrature signal generator 110.

The quadrature signal generator 110 generates quadrature signals 130 based on the in-phase signals 115, control signal 120 and lock signal 125. The control signal 120 controls the frequency of the quadrature signals 130 during initialization of the quadrature signal generator 110. In one embodiment, the control signal 120 causes the quadrature signals 130 to have approximately the same frequency while the in-phase signal generator 105 locks the in-phase signals 115 to the reference signal. In this embodiment, the quadrature signal generator 110 locks the quadrature signals 130 to the in-phase signals 115 after the in-phase signal generator 105 locks the in-phase signals to the reference signal.

Figure 2:
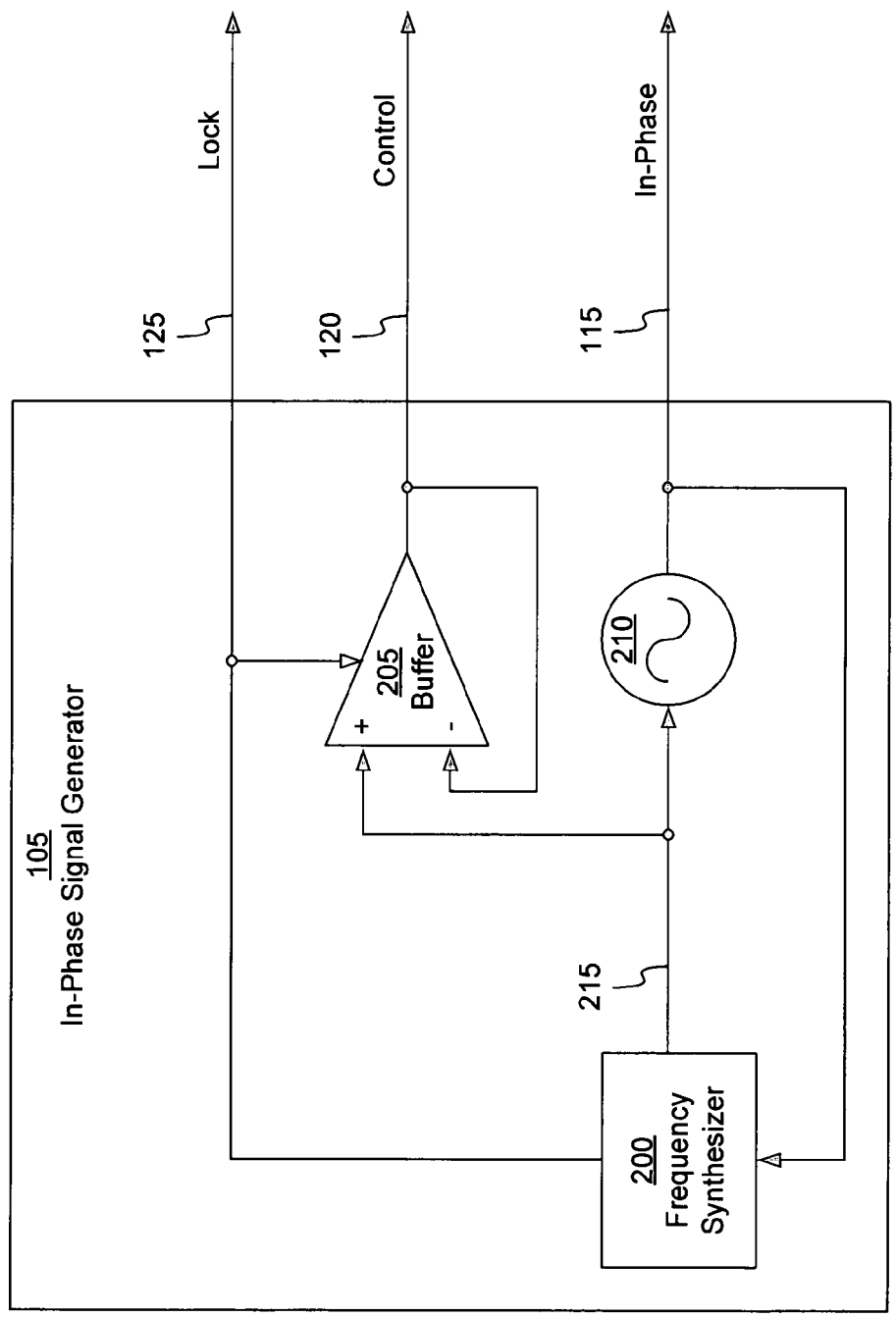
FIG. 2 is a block diagram of an exemplary in-phase signal generator shown in FIG. 1, in accordance with the present invention.

Referring now to FIG. 2, an exemplary in-phase signal generator 105 is shown. The exemplary in-phase signal generator 105 includes a frequency synthesizer 200, a buffer 205, and an in-phase voltage controlled oscillator (IVCO) 210. The frequency synthesizer 200 generates a signal 215 for controlling the operation of the IVCO 210 and provides the signal 215 to the IVCO 210, as is described more fully herein. Additionally, the frequency synthesizer 200 generates the lock signal 125 and provides the signal 215 and the lock signal 125 to the buffer 205. The lock signal 125 controls the operation of the buffer 205, as is described more fully herein. It is to be appreciated that the frequency synthesizer 200 can be a conventional frequency synthesizer as would be recognized by one skilled in the art.

The IVCO 210 generates the in-phase signals 115 based on the signal 215 received from the frequency synthesizer 200. In one embodiment, the signal 215 is a voltage level and the in-phase signals 115 have a sinusoidal waveform. In another embodiment, the frequency of the in-phase signals 115 varies with the voltage level of signal 215. The IVCO 210 provides the in-phase signal 115 to the frequency synthesizer 200, as is described more fully herein. It is to be appreciated that the IVCO 210 can be a conventional VCO as would be recognized by one skilled in the art.

The buffer 205 generates the control signal 120 based on the signal 215 and the lock signal 125 received from the frequency synthesizer 200. In one embodiment, the control signal 120 has a substantially similar waveform to the signal 215 received from the frequency synthesizer 200. In this embodiment, the buffer 205 amplifies signal 215 to generate the control signal 120. For example, the buffer 205 can increase the current drive of the signal 215 to generate the control signal 120. Further, in this embodiment, the lock signal 125 controls the operation of the buffer 205 to enable or disable the buffer 205 from generating the control signal 120.

In one embodiment, the control signal 120 generated by the buffer 205 is also an input to the buffer 205. In this embodiment, the control signal 120 controls the gain of the buffer 205 so that the buffer 205 has a unity gain. It is to be appreciated that the buffer 205 can be a conventional unity gain operational amplifier (OpAmp) as would be recognized by one skilled in the art. It is further to be appreciated that the buffer 205 is optional in the present invention and that the frequency synthesizer 200 can directly generate the signal 215 and the control signal 120 in one embodiment of the present invention.

Figure 3:
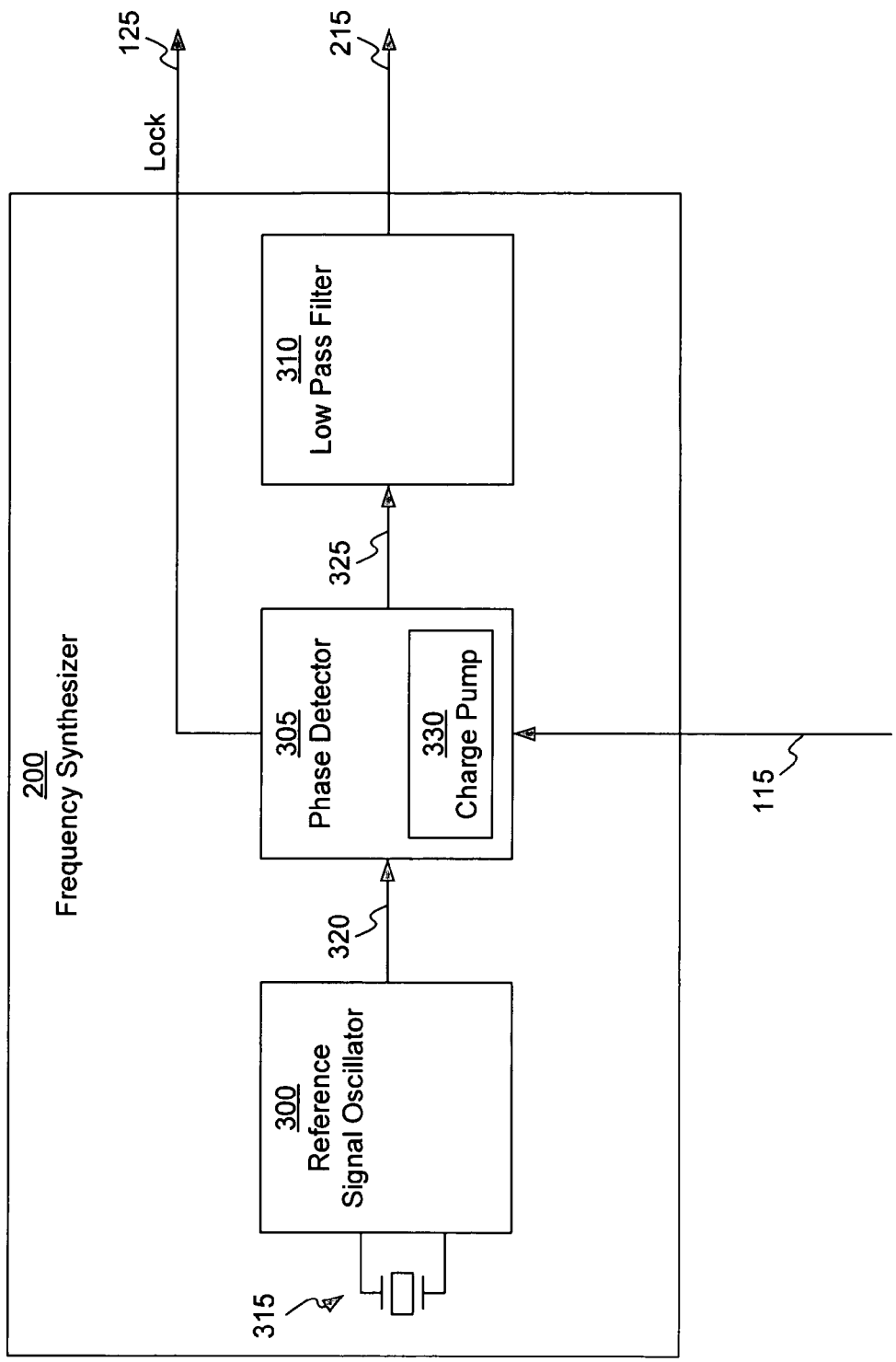
FIG. 3 is a block diagram of an exemplary frequency synthesizer shown in FIG. 2, in accordance with one embodiment of the present invention.

Referring now to FIG. 3, an exemplary frequency synthesizer 200 is shown. The exemplary frequency synthesizer 200 includes a reference signal oscillator 300, a phase detector 305, and a low pass filter 310. The reference signal oscillator 300 generates a reference signal 320 and provides the reference signal 320 to the phase detector 305. In one embodiment, the reference signal 320 has a sinusoidal waveform and a predetermined frequency. In another embodiment, the frequency of the in-phase signals 115 is approximately the same as the frequency of the reference signal 320. In still another embodiment, the frequency of the in-phase signals 115 is a multiple of the frequency of the reference signal. In yet another embodiment, the frequency of the in-phase signals 115 is a fraction of the frequency of the reference signal.

In another embodiment, the frequency synthesizer 200 includes a crystal 315 coupled to the reference signal oscillator 300. In this embodiment, the frequency of the reference signal 320 is based on the piezoelectric properties of the crystal 315, as would be appreciated by one skilled in the art. It is to be understood that the crystal 315 is optional in the present invention and that the reference signal oscillator 300 can generate the reference signal 320 without a crystal 315. It is further to be appreciated that the reference signal oscillator 300 can be a conventional oscillator for generating a reference signal that has a substantially fixed frequency, as would be recognized by one skilled in the art.

The phase detector 305 generates a signal 325 based on the reference signal 320 and the in-phase signals 115, which is indicative of the phase difference between the reference signal 320 and the in-phase signal 115. In one embodiment, the signal 325 is a voltage level representing the phase difference between the reference signal 320 and the in-phase signals 115. In another embodiment, the phase detector 305 can include a charge pump 330 for generating current pulses in the signal 325, which are indicative of the phase difference between the reference signal 320 and the in-phase signals 115. The phase detector 305 provides the signal 325 to the low pass filter 310.

The phase detector 305 also generates the lock signal 125, which indicates whether the in-phase signals 115 are locked to the reference signal 320. For example, the lock signal 125 can have a high voltage level when the in-phase signals 115 are locked to the reference signal 320 and a low voltage level when the in-phase signals 115 are not locked to the reference signal 320. It is to be appreciated that the phase detector 305 can be a conventional phase detector as would be recognized by one skilled in the art.

The low pass filter 310 passes low frequency signals (e.g., DC voltage signals) and attenuates high frequency signals. In one embodiment, the low pass filter 310 functions to integrate the current pulses in the signal 325 received from the phase detector 305 to produce the signal 215. In this embodiment, the signal 215 is a voltage level representing the phase difference between the reference signal 320 and the in-phase signals 115. It is to be appreciated that the low pass filter 310 can be a conventional low pass filter as would be recognized by one skilled in the art.

In one embodiment, the combination of the reference signal oscillator 300, phase detector 305, and low pass filter 310 form a phase-locked loop (PLL) as would be appreciated by one skilled in the art. In this embodiment, the in-phase signals 115 lock to the reference signal 320 during initialization of the in-phase signal generator 105, as is described more fully herein.

Figure 4A:
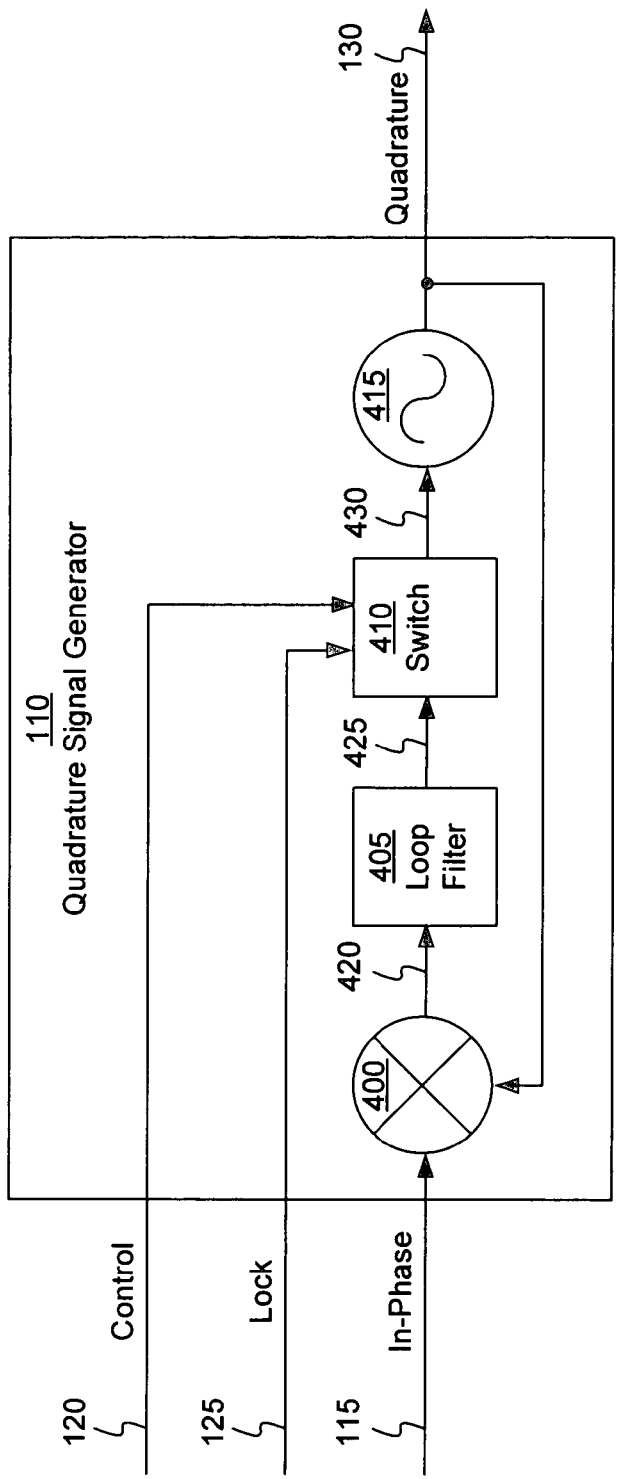
FIG. 4a is a block diagram of an exemplary quadrature signal generator shown in FIG. 1, in accordance with one embodiment of the present invention.

Referring now to FIG. 4a, an exemplary quadrature signal generator 110 is shown. The exemplary quadrature signal generator 110 includes a multiplier 400, a loop filter 405, a switch 410, and a quadrature voltage controlled oscillator (QVCO) 415. The multiplier 400 receives the in-phase signals 115 from the in-phase signal generator 105 (FIG. 1) and receives the quadrature signal 130 from the QVCO 415. The multiplier 400 generates a signal 420 that represents the phase difference between the in-phase signal 115 and the quadrature signals 130 and provides the signal 420 to the loop filter 405.

In one embodiment, the signal 420 is a voltage level that is indicative of the phase difference between the in-phase signal 115 and the quadrature signal 130. In another embodiment, the signal 420 includes current pulses that are indicative of the phase difference between signal 420 and the quadrature signal 130. In still another embodiment, the magnitude of the signal 420 is minimal when a 90 degree phase difference exists between the signal 420 and the quadrature signals 130.

The loop filter 405 generates a signal 425 based on the signal 420 received from the multiplier 400. In one embodiment, the loop filter 405 functions to pass low frequency signal components (e.g., DC voltage signals) and to attenuate high frequency component signals of the signal 420 (e.g., a low pass filter). In another embodiment, the loop filter 405 functions to integrate current pulses in the signal 420 to generate the signal 425. In this embodiment, the signal 425 is a voltage level representing the phase difference between the in-phase signal 115 and the quadrature signal 130. The loop filter 405 provides the signal 425 to the switch 410. It is to be appreciated that the loop filter 405 can be a conventional loop filter as would be recognized by one skilled in the art.

The switch 410 receives the signal 425 from the loop filter 405, the control signal 120 from the frequency synthesizer 200 of the in-phase signal generator 105 (FIG. 2), and the lock signal 125 from the phase detector 305 in the frequency synthesizer 200 (FIG. 3). In one embodiment, the lock signal 125 controls the output of the switch 410. In this embodiment, the switch 410 selects the control signal 120 or the signal 425, based on the lock signal 125, and passes the selected signal to the QVCO 415 as signal 430.

In one embodiment, the switch 410 passes the control signal 120 to the QVCO 415 as signal 425 when the lock signal 125 indicates that the in-phase signals 115 are not locked to the reference signal 320 (FIG. 3). In this embodiment, the voltage level of the signal 215 (FIG. 2) provided to the IVCO 210. (FIG. 2) will be substantially the same as the voltage level of the control signal 120 provided to the QVCO 415 when the lock signal 125 indicates that the in-phase signals 115 are not locked to the reference signal 320. Further, in this embodiment, the switch 410 passes the signal 425 from the loop filter 405 to the QVCO 415 when the lock signal 125 indicates that the in-phase signals 115 are locked to the reference signal 320.

The QVCO 415 generates the quadrature signals 130 based on the signal 430 received from the switch 410. In one embodiment, the signal 430 is a voltage level, and the quadrature signals 130 have a sinusoidal waveform. In this embodiment, the frequency of the quadrature signals 130 varies with the voltage level of the signal 430. It is to be appreciated that the QVCO 415 can be a conventional VCO as would be recognized by one skilled in the art. The QVCO 415 provides the quadrature signals 130 to the multiplier 400. In one embodiment, the combination of the multiplier 400, loop filter 405, switch 410, and QVCO 415 form a phase-locked loop (PLL) as would be appreciated by one skilled in the art.

Figure 4B:
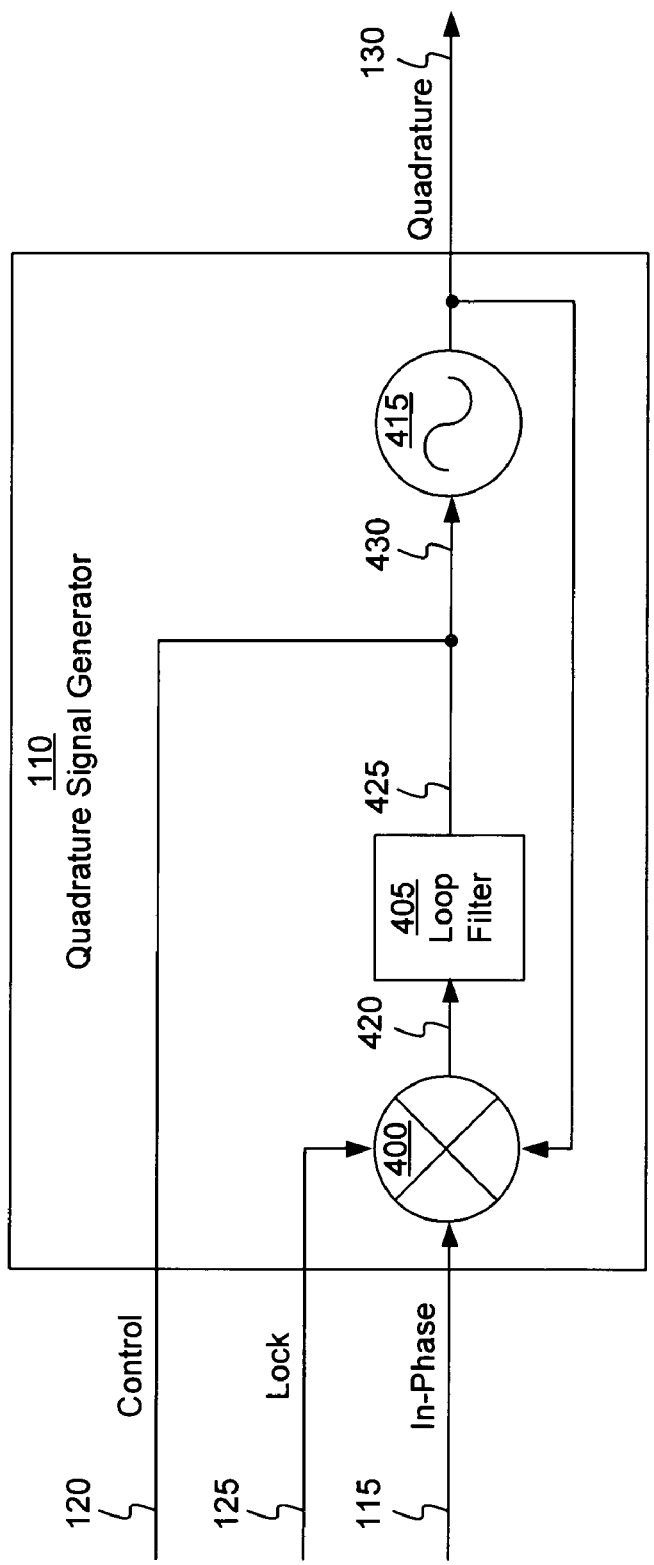
FIG. 4b is a block diagram of another exemplary quadrature signal generator shown in FIG. 1, in accordance with one embodiment of the present invention.

Referring now to FIG. 4b, another exemplary quadrature signal generator 110 is shown. The exemplary quadrature signal generator 110 includes a multiplier 400, a loop filter 405, and a quadrature voltage controlled oscillator (QVCO) 415. In one embodiment, the function and operation of the quadrature signal generator 110 of FIG. 4b is substantially similar to the function and operation of the quadrature signal generator 110 of FIG. 4a as is described herein.

The multiplier 400 of FIG. 4b receives the in-phase signals 115 from the in-phase signal generator 105 (FIG. 1) and receives the quadrature signal 130 from the QVCO 415. The multiplier 400 generates a signal 420 that represents the phase difference between the in-phase signal 115 and the quadrature signals 130 and provides the signal 420 to the loop filter 405.

The loop filter 405 generates a signal 425 based on the signal 420 received from the multiplier 400. In one embodiment, the loop filter 405 functions as a low pass filter, as is described more fully herein with respect to FIG. 4a. In the quadrature signal generator 110 of FIG. 4b, the signal 425 and the control signal 120 combine to form signal 430, which is provided to the QVCO 415 to control operation of the QVCO 415. For example, the signal 425 and the control signal 120 can combine within a wired-OR connection to form the signal 430, as would be appreciated by one skilled in the art.

In one embodiment, the multiplier 400 receives the lock signal 125 from the phase detector 305 in the frequency synthesizer 200 (FIG. 3). In this embodiment, the multiplier 400 is disabled from generating the signal 420 when the lock signal 125 indicates that the in-phase signals 115 are not locked to the reference signal 320 (FIG. 3). Consequently, in this embodiment, the signal 430 is substantially similar to the control signal 120 when the lock signal 125 indicates that the in-phase signals 115 are not locked to the reference signal 320. Also, in this embodiment, the signal 430 is substantially similar to the signal 425 when the lock signal 125 indicates that the in-phase signals 115 are locked to the reference signal 320 because the buffer 205 (FIG. 2) is disabled from providing the control signal 120 to the quadrature signal generator 110.

The QVCO 415 generates the quadrature signals 130 based on the signal 430 and provides the quadrature signals 130 to the multiplier 400. In one embodiment, the combination of the multiplier 400, loop filter 405, and QVCO 415 form a phase-locked loop (PLL) as would be appreciated by one skilled in the art.

Figure 5:
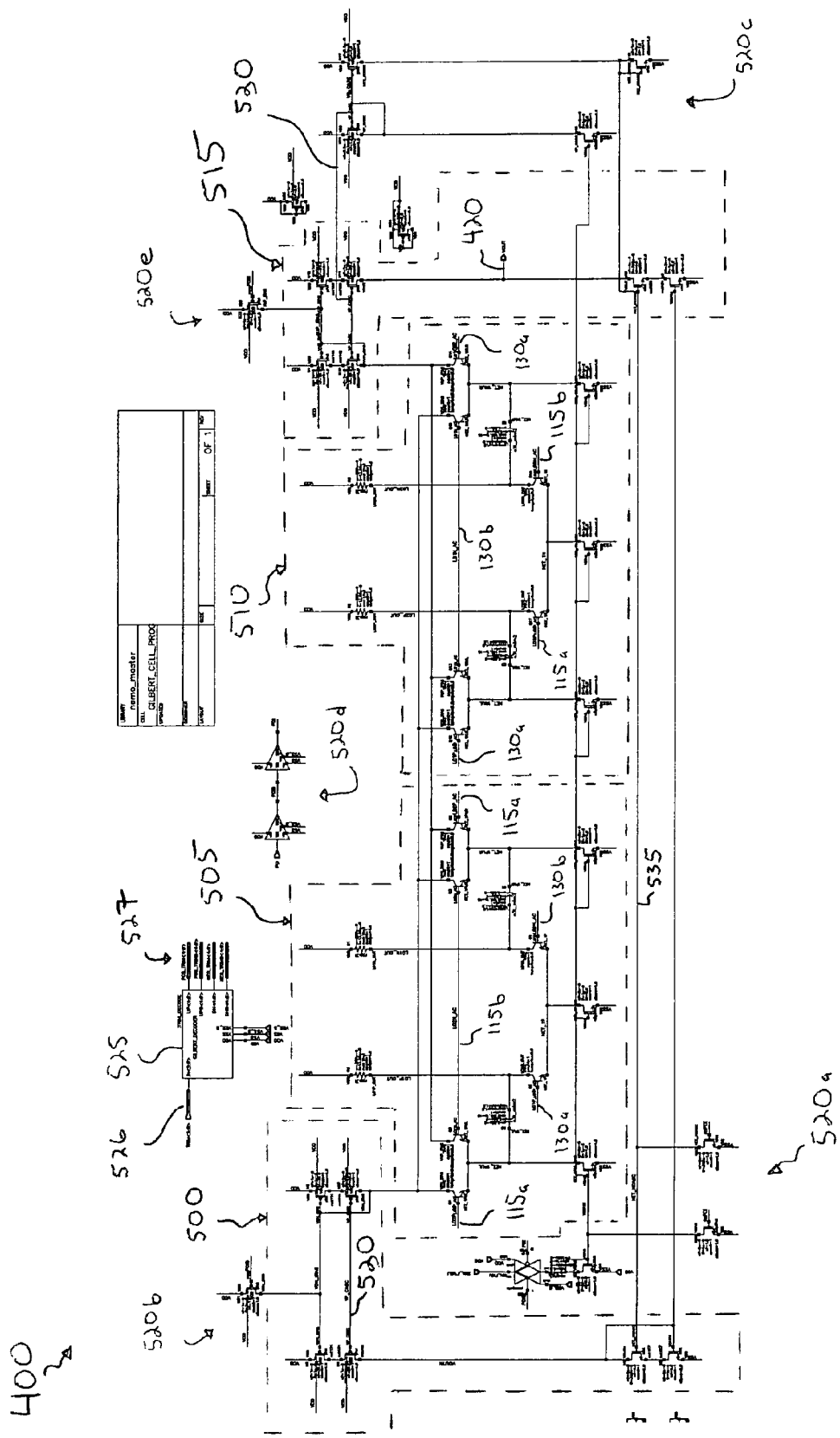
FIG. 5 is a circuit diagram of an exemplary multiplier, in accordance with one embodiment of the present invention.

Referring now to FIG. 5, a circuit diagram of one embodiment of the multiplier 400 is shown. The multiplier 400 includes a first current mirror 500, a first multiplier circuit 505, a second multiplier circuit 510, and a second current mirror 515. Additionally, the multiplier 400 includes various devices 520a-e (e.g., MOS transistors) to bias the first current mirror 500, second current mirror 515, first multiplier circuit 505, and second multiplier circuit 510, as is described more fully herein. In one embodiment, the multiplier 400 includes a decoder 525 for trimming the multiplier 400.

The first multiplier circuit 505 receives the in-phase signals 115a-b from the IVCO 210 of the in-phase signal generator 105 (FIG. 1) and the quadrature signals 130a-b of the quadrature signal generator 110 and multiplies the in-phase signals 115 by the quadrature signals 130a-b to generate differential output signals. The first multiplier circuit 505 is coupled to and provides one of the differential output signals to the first current mirror 500 and another differential output signal to the second current mirror 515.

The second multiplier circuit 510 receives the in-phase signals 115a-b from the IVCO 210 of the in-phase signal generator 105 (FIG. 1) and the quadrature signals 130a-b of the quadrature signal generator 110 and multiplies the in-phase signals 115 by the quadrature signals 130 to generate differential output signals. The second. multiplier circuit 510 is coupled to and provides one of the differential output signals to the first current mirror 500 and the other differential output signal to the second current mirror 515.

The first current mirror 500 and the second current mirror 515 source or sink current to generate a portion of the signal 420 based on the differential output signals (e.g., multiplication of the in-phase signals by the quadrature signals) generated by the first multiplier circuit 505 and the second multiplier circuit 510. It is to be appreciated that the first current mirror 500 and the second current mirror 515 in combination convert the differential output signals generated by the first multiplier circuit 505 and the second multiplier circuit 510 into a single ended signal 420. It is also to be appreciated that the single ended signal 420 represents the multiplication of the in-phase signals 115 and quadrature signals 130 received by both the first multiplier circuit 505 and the second multiplier circuit 510.

In one embodiment, the devices 520a-e generate various biasing voltages and provide the biasing voltages to the first current mirror 500, second current mirror 515, first multiplier circuit 505, and second multiplier circuit 510. For example, the multiplier 400 can be a monolithic integrated circuit, and the biasing voltages generated by the devices 520-a-e can be based on the process characteristics or temperature of the integrated circuit. Further, in this example, the voltage levels generated by the devices 520a-e can be based on the supply voltage (e.g., VDD) applied to the multiplier 400.

In one embodiment, the devices 520 (e.g., device 520c) generate a signal 530 (e.g., VP_CASC) that biases the cascode transistors in both the upper stack of the first current mirror 500 and the upper stack of the second current mirror 515. Additionally, in this embodiment, the devices 520 (e.g., device 520c) generate a signal 535 (e.g., NET_CASC) that biases the cascode transistors in both the lower stack of the first current mirror 500 and the lower stack of the second current mirror 515. It is to be appreciated that the cascode transistors in the first current mirror 500 function to increase the output impedance of the first current mirror 500, which augments the precision of the first current mirror 500. It is further to be appreciated that the cascode transistors in the second current mirror 515 function to increase the output impedance of the second current mirror 515, which augments the precision of the second current mirror 515.

The decoder 525 receives signals 526 (e.g., "TRIM 5:0") from a control (not shown) and generates signals 527 (e.g., "POS_TRIM 4:0", "POS_TRIMB 4:0", "NEG_TRIM 4:0", and "NEG_TRIMB 4:0") based on the signals 526. The signals 527 control DC current sources (not shown) that source or sink DC current into the signal 420 to trim the phase error of the QVCO 415. In one embodiment, the input signals 526 and the output signals 527 are digital signals, and the DC current sources (not shown) are digitally controlled by the signals 527. In this embodiment, the DC current sources can be precisely controlled with signals 527 to precisely trim the QVCO 415. It is to be appreciated that the decoder 525 is optional in the multiplier 400.

Figure 6:
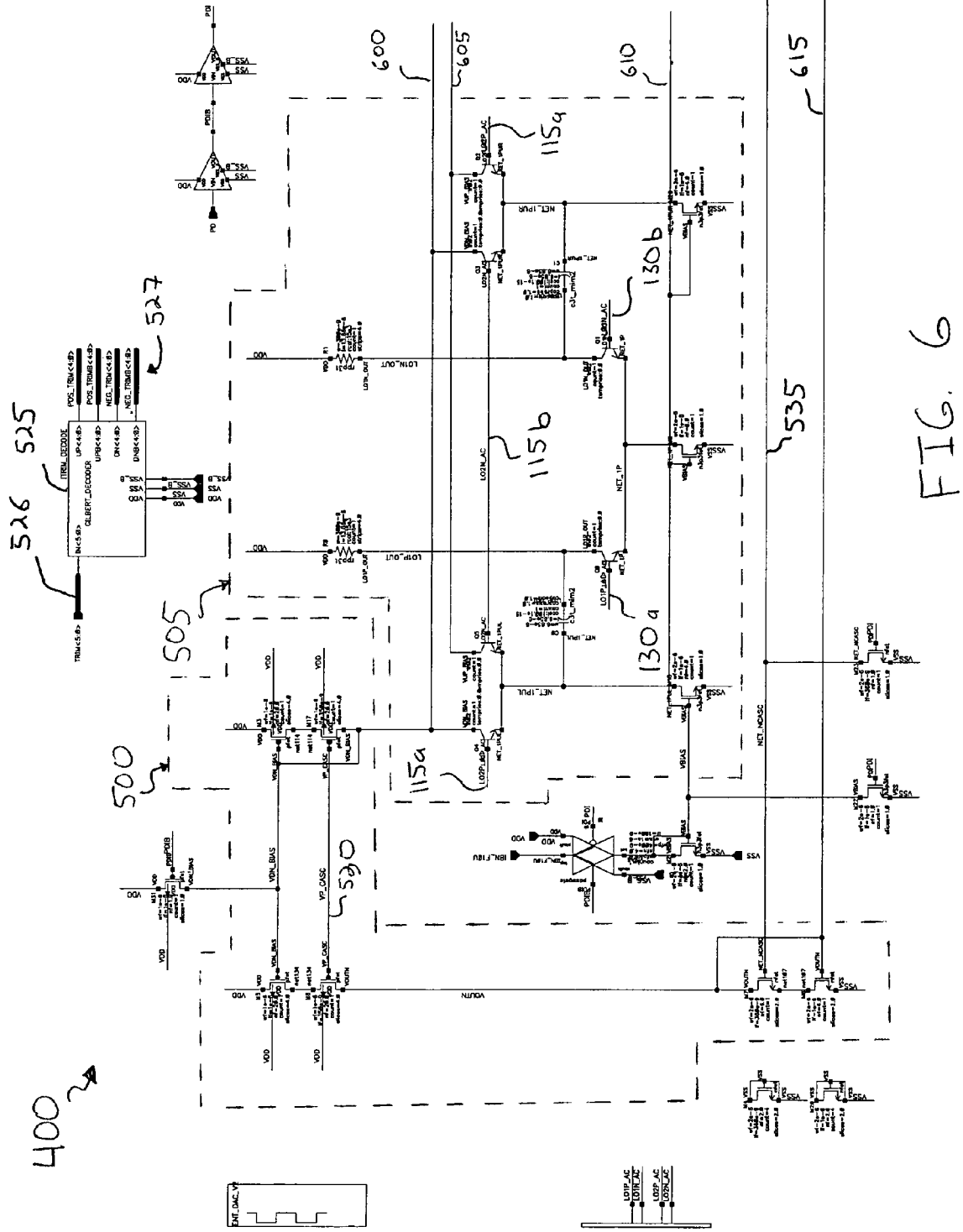
FIG. 6 is a circuit diagram of a portion of the multiplier shown in FIG. 5, in accordance with one embodiment of the present invention.

Referring now to FIG. 6, an exemplary first current mirror 500 and an exemplary first multiplier circuit 505 of the multiplier circuit of FIG. 5 are shown. In one embodiment, the first current mirror 500 is a cascode current mirror as would be appreciated by one skilled in the art. As shown in FIG. 6, the first multiplier circuit 505 includes a pair of transistors in a lower stack (e.g., bipolar transistors) AC coupled to a quad of transistors (e.g., bipolar transistors) in an upper stack through a pair of capacitors. Further, as shown in the Figure, the in-phase signals 115a-b are inputs to the quad of transistors in the first multiplier circuit 505, and the quadrature signals 130a-b are inputs to the pair of transistors in the first multiplier circuit 505.

Figure 7:
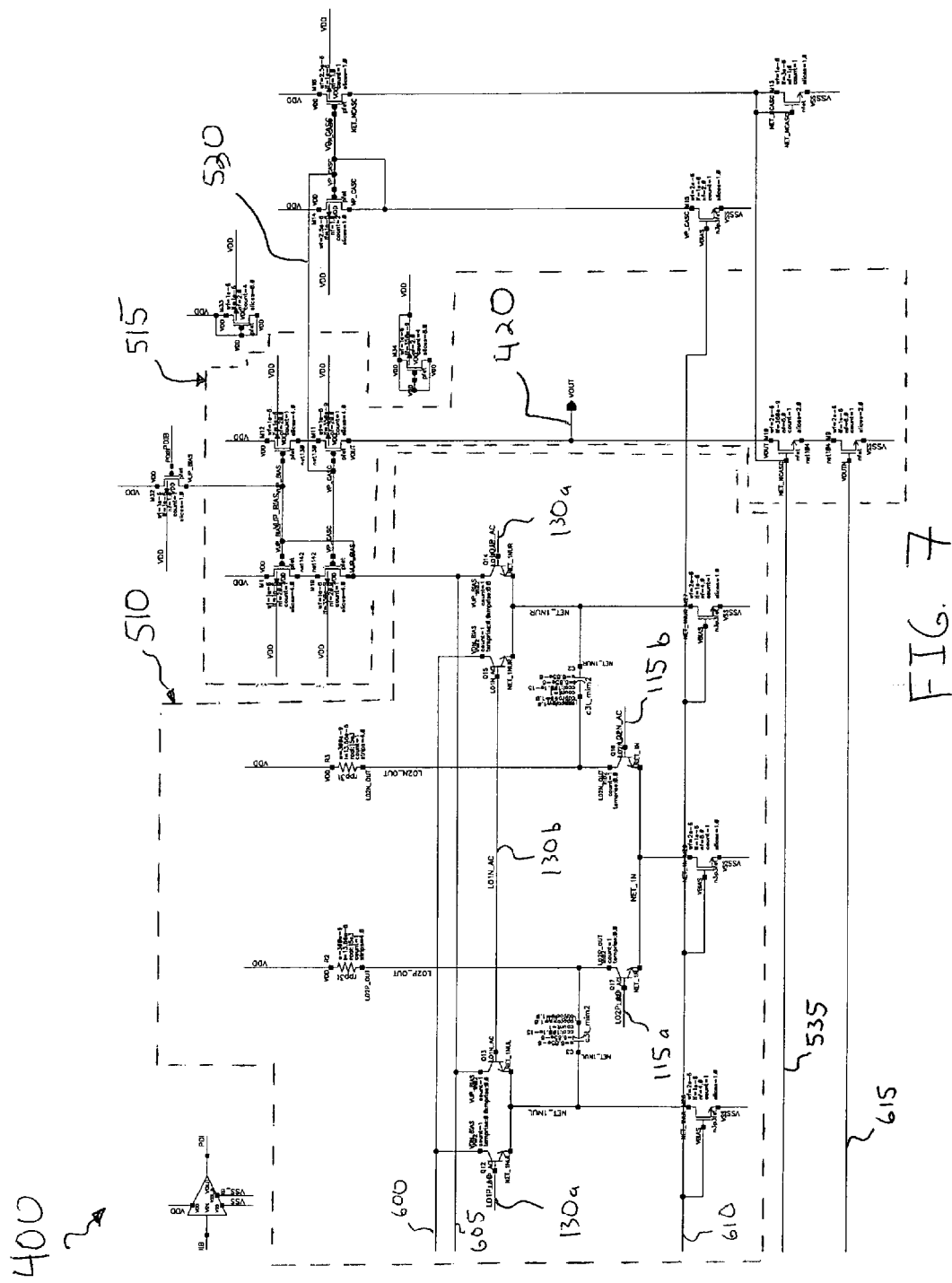
FIG. 7 is a circuit diagram of a portion of the multiplier shown in FIG. 5, in accordance with one embodiment of the present invention.

Referring now to FIG. 7, an exemplary second multiplier circuit 510 and an exemplary second current mirror 515 of the multiplier 400 of FIG. 5 are shown. In one embodiment, the second current mirror 515 is a cascode current mirror as would be appreciated by one skilled in the art. As shown in FIG. 6, the second multiplier circuit 510 includes a pair of transistors (e.g., bipolar transistors) in a lower stack AC coupled to a quad of transistors in an upper stack through a pair of capacitors. Further, as shown in the Figure, the quadrature signals 130a-b are inputs to the quad of transistors in the second multiplier circuit 510, and the in-phase signals 115a-b are inputs to the pair of transistors in the second multiplier circuit 510.

In one embodiment, the structure of the first multiplier circuit 505 is symmetrical to the structure of the second multiplier circuit 510 and the components (e.g., transistors) in the first multiplier circuit 505 are matched to the components in the second multiplier circuit 510. In this embodiment, the transfer characteristics (e.g., multiplication factor) of the first multiplier circuit 505 is substantially similar to the transfer characteristic of the second multiplier circuit 510. Although the transfer characteristics of the first multiplier circuit 505 and second multiplier circuit 510 are substantially similar to each other, the differential outputs generated by each of the first multiplier circuit 505 and second multiplier circuit 510 may differ in phase. For example, this phase difference may be the result of the asymmetrical structure or characteristics between the pair of transistors and quad of transistors in each of the first multiplier circuit 505 and second multiplier circuit 510.

In this embodiment, it is to be appreciated that the multiplication of the in-phase signal 115 by the quadrature signals 130 in both the first multiplier circuit 505 and the second multiplier circuit 515, and the conversion of the differential outputs signals generated by the first multiplier circuit 505 and second multiplier circuit 510 (which may differ in phase) into the single ended output signal 420 may result in a more accurate multiplication in contrast to a multiplier having only a single multiplier circuit. Additionally, the use of two multiplier circuits (e.g., 505 and 510) in the multiplier 400 allows each of the multiplication circuits (e.g., 505 and 510) to carry approximately half the current as would a multiplier having only a signal multiplier circuit.

Figure 8:
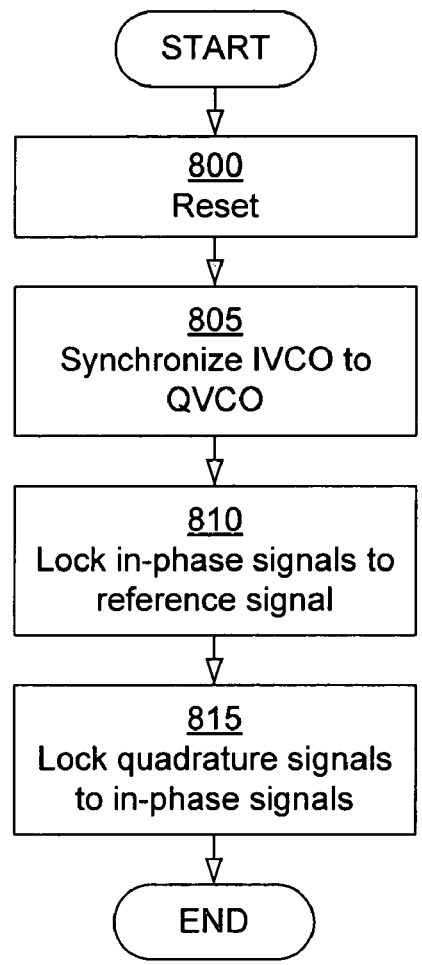
FIG. 8 is a flow chart for an exemplary method of initializing the quadrature generator shown in FIG. 1, in accordance with one embodiment of the present invention.

Referring now to FIG. 8, a flow chart of a method for initializing the quadrature generator 100 is shown. In step 800, the quadrature generator 100 (FIG. 1) is reset. After the quadrature generator 100 is reset, the lock signal 125 (FIG. 1) generated by the frequency synthesizer 200 (FIG. 2) indicates that the in-phase signals 115 (FIG. 2) are not locked to the reference signal 320 (FIG. 3). In one embodiment, the quadrature generator 100 includes a power-on reset circuit as would be appreciated by one skilled in the art.

In step 805, the IVCO 210 (FIG. 2) is synchronized to the QVCO 415. In this process, the quadrature signals 115 (FIG. 1) track the in-phase signals 115 (FIG. 1). In one embodiment, the buffer 205 is enabled when the lock signal 125 indicates that the in-phase signals 115 (FIG. 1) are not locked to the reference signal 320 (FIG. 3). When the buffer 205 is enabled, the buffer 205 generates the control signal 120 (FIG.

1), which is substantially similar to the signal 215 (FIG. 2) generated by the frequency synthesizer 200 and provided to the IVCO 210 in the in-phase signal generator 100. Further, the buffer 205 provides the control signal 120 to the switch 410 in the quadrature signal generator 110.

Also in step 805, the switch 410 passes the control signal 120 to the QVCO 415 in the quadrature signal generator 110 as the signal 430 when the lock signal 125 indicates that the in-phase signals 115 (FIG. 1) are not locked to the reference signal 320 (FIG. 3). Consequently, in this embodiment, the signal 215 provided to the IVCO 210 is substantially similar to the control signal 430 provided to the QVCO 415 when the lock signal 125 indicates that the in-phase signals 115 are not locked to the reference signal 320. Also in this embodiment, the IVCO 210 and QVCO 415 generate respective in-phase signals 115 and quadrature signals 130 that have approximately the same frequency.

In step 810, the in-phase signals 115 (FIG. 1) lock to the reference signal 320 (FIG. 3) generated in the frequency synthesizer 200. Because the signal 215 provided to the IVCO 210 by the frequency synthesizer 200 is substantially similar to the signal 430 provided to the QVCO 415 while the in-phase signals 115 lock to the reference signal 320, the quadrature signals 130 have approximately the same frequency of the in-phase signals 115. Once the in-phase signals 115 lock to the reference signal 320, the phase detector 305 (FIG. 3) causes the lock signal 125 to indicate that the in-phase signals 115 are locked to the reference signal 320.

In step 815, the quadrature signals 130 lock to the in-phase signals 115. In this process, the switch 410 passes the signal 425 received from the loop filter 405 to the QVCO 415 as signal 430 when the lock signal 125 indicates that the in-phase signals 115 are locked to the reference signal 320. When the switch 410 passes signal 425 to the QVCO 415, the in-phase signals 115 and quadrature signals 130 received by the multiplier 400 have approximately the same frequency and, thus, the quadrature signal generator 110 should be able to quickly lock the quadrature signals 130 to the in-phase signals 115 at approximately a 90 degree phase difference. In one embodiment, the buffer 205 is disabled when the lock signal 125 indicates that the in-phase signals 115 are locked to the reference signal 320. In this embodiment, the buffer 205 does not provide the control signal 120 to the switch 410 when the buffer 205 is disabled.

The embodiments discussed herein are illustrative of the present invention. As these embodiments of the present invention are described with reference to illustrations, various modifications or adaptations of the methods and/or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings should not be considered in a limiting sense, as it is understood that the present invention is in no way limited to only the embodiments illustrated.

What is claimed is:

1. A quadrature signal generator system for generating in-phase and quadrature signals, comprising:
    an in-phase signal generator having a first voltage controlled oscillator (VCO) configured to generate in-phase signals;
    a quadrature signal generator having a second voltage controlled oscillator (VCO) configured to generate quadrature signals;
    a first VCO control signal generator for producing a first VCO control signal; and
    a second VCO control signal generator for producing a second VCO control signal;
    wherein the first VCO control signal is used to control the first and second voltage controlled oscillators whilst the first voltage controlled oscillator is being locked to a reference signal, and thereafter the second VCO control signal is used to control the second VCO to produce the quadrature signals.

2. The system according to claim 1, wherein the second VCO control signal generator is configured to receive the in-phase signals generated by the in-phase signal generator.

3. The system according to claim 1, wherein the first VCO control signal generator is configured to detect when said first VCO is locked to said reference signal, and to output a lock signal in dependence thereon, the system further comprising a switching arrangement configured to receive said lock signal, and to switch the control signal provided to said second VCO to said second VCO control signal in dependence on said lock signal.

4. The system according to claim 3, wherein said lock signal takes a first value whilst said first VCO is being locked to a reference signal and takes a second value thereafter.

5. The system according to claim 1 further comprising a buffer, the first VCO control signal being provided to said second VCO via said buffer.

6. A method of generating in-phase and quadrature signals, comprising:
    a) generating, using a first voltage controlled oscillator, an in-phase signal in response to a first control signal;
    b) locking said in-phase signal to a reference signal;
    c) generating, using a second voltage controlled oscillator, a quadrature signal in response to the first control signal, whilst said in-phase signal is being locked to said reference signal; and
    d) once said in-phase signal has been locked to said reference signal, applying a second control signal to said second voltage controlled oscillator in place of said first control signal, so as to generate said quadrature signal in phase quadrature to said in-phase signal.

7. The method according to claim 6 further comprising the step of buffering said first control signal, said generating of said quadrature signal being performed in response to said buffered first control signal.

* * * * *